(12) United States Patent
Stevenson et al.

(10) Patent No.: US 7,619,421 B2
(45) Date of Patent: Nov. 17, 2009

(54) SYSTEMS AND METHODS FOR DETECTING CAPACITOR PROCESS VARIATION

(75) Inventors: Jan-Michael Stevenson, Frisco, TX (US); Timothy M. Magnusen, Murphy, TX (US)

(73) Assignee: Microtune (Texas), L.P., Plano, TX (US)

( * ) Notice: Subject to any disclaimer, the term of this patent is extended or adjusted under 35 U.S.C. 154(b) by 232 days.

(21) Appl. No.: 11/513,521

(22) Filed: Aug. 31, 2006

(65) Prior Publication Data

US 2008/0068108 A1     Mar. 20, 2008

(51) Int. Cl.
G01R 27/26     (2006.01)
H03B 5/00      (2006.01)

(52) U.S. Cl. .................. 324/681; 324/672; 324/684; 327/553

(58) Field of Classification Search ............ 324/681, 324/672, 684
See application file for complete search history.

(56) References Cited

U.S. PATENT DOCUMENTS

| | | | |
|---|---|---|---|
| 3,281,698 A * | 10/1966 | Rose, Jr. et al. ............ 455/263 |
| 3,626,285 A | 12/1971 | Hartke | |
| 5,204,972 A | 4/1993 | Hashimoto | |
| 5,973,633 A * | 10/1999 | Hester ........................ 341/172 |
| 6,285,865 B1 | 9/2001 | Vorenkamp et al. | |
| 6,750,565 B2 * | 6/2004 | Degen et al. ................ 307/131 |
| 6,784,754 B1 | 8/2004 | Cheng | |
| 2002/0105331 A1 * | 8/2002 | Brune et al. ................ 324/326 |
| 2002/0126792 A1 | 9/2002 | Fuhrman et al. | |
| 2003/0025563 A1 | 2/2003 | Christensen | |
| 2003/0076139 A1 * | 4/2003 | Miyagawa et al. .......... 327/156 |
| 2005/0052225 A1 * | 3/2005 | Cusinato ..................... 327/552 |

FOREIGN PATENT DOCUMENTS

| | | |
|---|---|---|
| EP | 1 282 227 | 2/2003 |
| EP | 1 596 208 | 11/2005 |
| GB | 2 258 048 | 1/1993 |

OTHER PUBLICATIONS

International Search Report and the Written Opinion issued for PCT Application No. PCT/US2007/075671; dated Mar. 14, 2008; 10 pages.
U.S. Appl. No. 11/441,816, Stevenson et al.
U.S. Appl. No. 11/513,520, Stevenson et al.
U.S. Appl. No. 11/513,550, Stevenson et al.
International Search Report and Written Opinion issued for PCT/US2007/075686 dated Apr. 17, 2008, 12 pgs.
Xin, He et al., "A 2.5 GHz Low-Power, High Dynamic Range, Self-Tuned Q-Enhanced LC Filter in SOI", IEEE Journal of Solid-State Circuits, Piscataway, NJ, US, vol. 40. No. 8, Aug. 2005, 11 pgs.

(Continued)

*Primary Examiner*—Vincent Q Nguyen
*Assistant Examiner*—John Zhu
(74) *Attorney, Agent, or Firm*—Fulbright & Jaworski L.L.P.

(57) ABSTRACT

A method for detecting capacitor variation in a device comprises operating an oscillator in the device, the oscillator being an Inductive-Capacitive (LC) oscillator and including an inductor of known value and a capacitor under test, comparing an output of the oscillator to a reference output, and evaluating variation for a plurality of capacitors in the device based on the comparing.

4 Claims, 2 Drawing Sheets

OTHER PUBLICATIONS

Li, Shaorui et al., "An Integrated 1.5 V 6 GHz Q-Enhanced LC CMOS Filter with Automatic Quality Factor Tuning Using Conductance Reference", Radio Frequency Integrated Circuits (RFIC) Symposium, Digest of Papers, Long Beach, CA, USA, Jun. 12-14, 2005, Piscataway, NJ, USA, 4 pgs.

International Search Report and Written Opinion issued for PCT/US2007/075677 dated Apr. 3, 2008, 17 pgs.

U.S. Office Action issued for U.S. Appl. No. 11/513,550 dated Feb. 23, 2009, 6 pgs.

U.S. Office Action issued for U.S. Appl. No. 11/513,520 dated Mar. 19, 2009, 6 pgs.

* cited by examiner

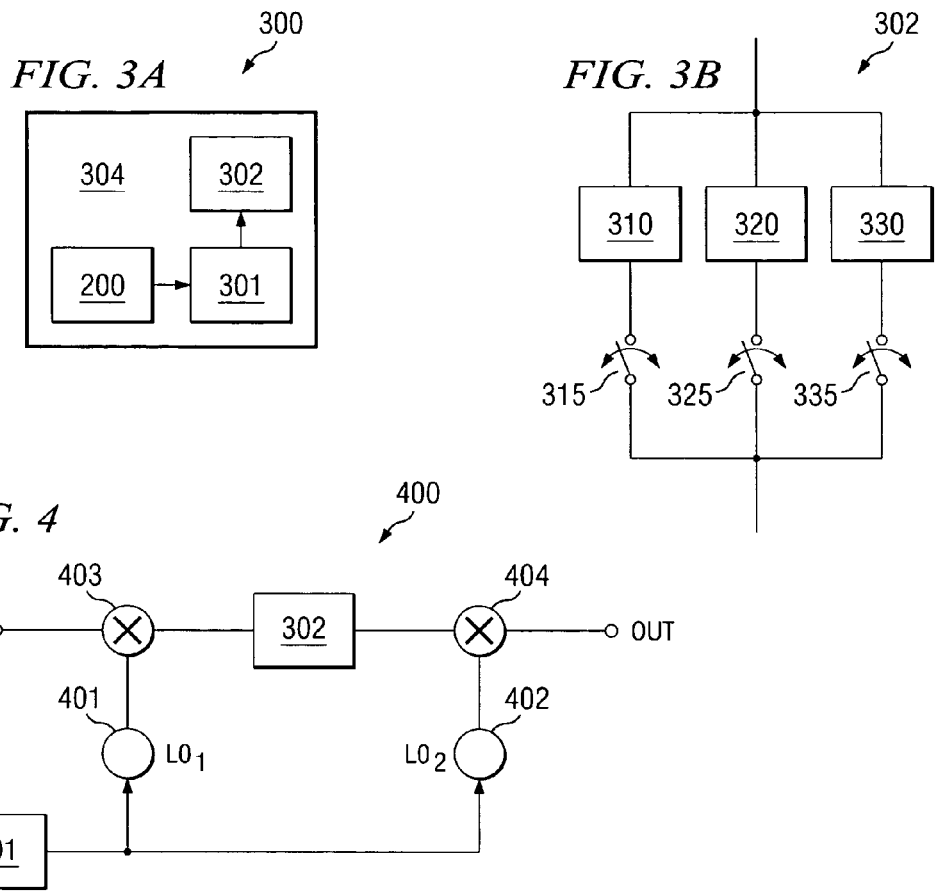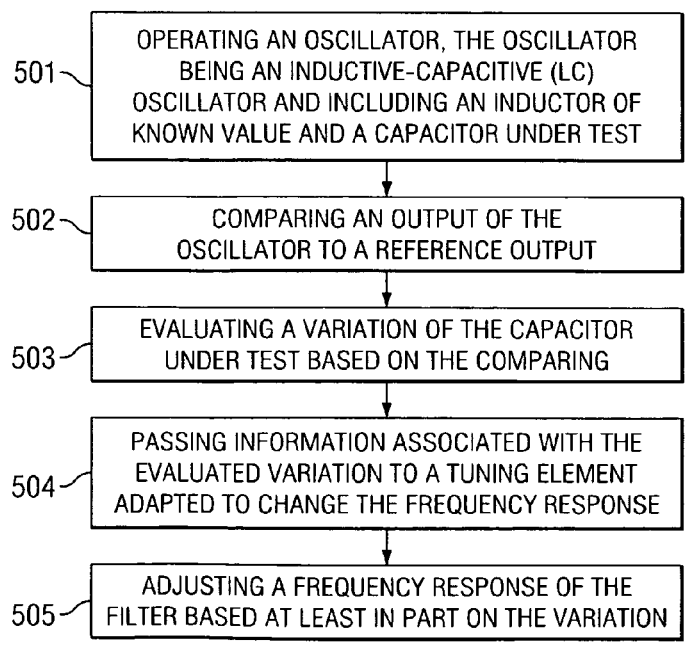

SYSTEMS AND METHODS FOR DETECTING CAPACITOR PROCESS VARIATION

CROSS-REFERENCE TO RELATED APPLICATIONS

This application is related to U.S. patent application Ser. No. 11/513,550, filed concurrently herewith, and entitled "SYSTEMS AND METHODS FOR FILTER CENTER FREQUENCY LOCATION," and to U.S. patent application Ser. No. 11/513,520, filed concurrently herewith, and entitled "RF FILTER ADJUSTMENT BASED ON LC VARIATION," the disclosures of which are hereby incorporated herein by reference.

TECHNICAL FIELD

Various embodiments of the present invention relate to measuring variation of one or more capacitors in semiconductor components.

BACKGROUND OF THE INVENTION

Currently, it is common to form various systems on semiconductor chips. General purpose processors, digital signal processors, Application Specific Integrated Circuits (ASICs), and the like are manufactured by forming a variety of transistors, resistors, capacitors, inductors, etc., on a semiconductor substrate.

The processes that are used to form the circuit elements on a semiconductor substrate are sometimes less than ideal and cause some amount of process variation in the circuit elements. Process variation, in general, is the difference between an actual quality of a circuit element and its nominal quality. For instance, capacitors formed in semiconductor chips tend to have process variation of up to approximately plus or minus 20%, depending on the process. Thus, the actual capacitance of a given capacitor on a chip, measured in Farads, may be significantly different from the intended or nominal value specified in the design.

One application that uses capacitors is a tuner circuit. Specifically, such tuner circuits may include input filtering functions to condition input signals before they are passed to other tuner components. Most such filters are Inductive-Capacitive (LC) circuits. The frequency response of a given LC filter depends on the values of the capacitor(s) and inductor(s) in the circuit. Thus, capacitor variation can cause frequency response shifts in filters, causing non-ideal operation.

Prior art solutions have compensated for capacitor variation by measuring time-constant change in one or more Resistive-Capacitive (RC) circuits. However, since the time constant in an RC circuit is equal to resistance times capacitance, and since resisters also usually include a non-negligible amount of variation, time constant deviation fails to allow for the isolation of capacitor process variation. Thus, capacitor variation can only be approximated or guessed from the time constant deviation. The prior art offers no system that can accurately measure capacitor variation for a group of capacitors in an application.

BRIEF SUMMARY OF THE INVENTION

Various embodiments of the present invention are directed to systems and methods which evaluate capacitor variation for one capacitor or a plurality of capacitors in a device. Such embodiments assess capacitor process variation in the device accurately because the measurement of the variation isolates capacitor variation from other factors, such as resistor process variation.

In one example system, a capacitor under test is part of an LC oscillator. The LC oscillator includes at least one inductor of known value. Generally, inductors disposed on chips have minimal process variation (i.e., within 1% of nominal value); thus, the value of a given inductor is often assumed to be its nominal value. The LC oscillator is operated, and its output is captured. The output is compared to a value that represents the output of the oscillator under ideal performance. If process variation has caused the capacitor under test to have a smaller than nominal capacitance, then the LC oscillator will oscillate at higher frequency than it would had the capacitor been at nominal value. On the other hand, larger than nominal capacitance will cause the LC oscillator to exhibit lower frequency performance. The captured output, in one example, is a count of cycles of the LC oscillator, and the count is compared to a number of ideal cycles. The difference represents a percentage change in frequency.

The percentage change in frequency can then be used to evaluate the capacitor variation. When the capacitor under test and other capacitors are formed on a same device during the same processes, it may generally be assumed that capacitor variation is the same or approximately the same for all such capacitors. Thus, the evaluated variation may be associated with variation of the other capacitors in the device. Evaluation of the variation may be performed, for example, by circuit-based logic or machine executable code.

One example use for evaluated capacitor variation is in the tuning of filters. Many filters for conditioning signals employ capacitors in LC, and/or RC circuits. Thus, capacitor variation causes some shift in frequency response for each such filter. A tuning component based on circuit logic and/or machine executable code can use the evaluated capacitor variation to compensate for the change in frequency response.

In one embodiment, a filter component includes a plurality of individual filter elements, each with a passband that is centered at a different frequency. Each individual filter element is associated with a frequency range. As an application selects different frequency components of an input signal, a tuning component selects one of the filter elements based on the range that the desired signal component falls in. The frequency values at which filters are switched may be referred to as "breakpoints." In this example system, a tuning component uses the evaluated capacitor variation to adjust the breakpoints to compensate for capacitor variation in each of the individual filter elements.

In another embodiment, selecting one or more individual filter elements is performed during manufacturing or testing. For instance, once the capacitor variation is ascertained, one or more connections may be made or broken (e.g., as in a programmable logic device) in a permanent or semi-permanent way, thereby setting the operating parameters of the filter.

Rather than (or in addition to) tuning a filter based upon evaluated capacitor variation, it is also possible in some embodiments to adjust one or more other circuit components. For instance, in an example RF tuner circuit, a filter is preceded in the RF signal path by a first mixer and followed in the RF signal path by a second mixer. Either or both of the mixers may be adjusted to adapt to the offset center frequency of the filter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 3A is an illustration of an exemplary system adapted according to one embodiment of the invention;

FIG. 3B is an illustration of an exemplary filter component adapted according to one embodiment;

FIG. 4 is an illustration of an exemplary system adapted according to one embodiment of the invention; and FIG. 5 is an illustration of an exemplary method adapted according to one embodiment of the invention.

DETAILED DESCRIPTION OF THE INVENTION

Figure 1:
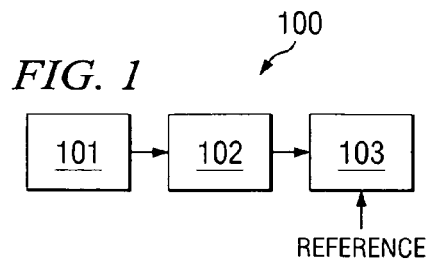
FIG. 1 is an illustration of an exemplary system adapted according to one embodiment of the invention.

FIG. 1 is an illustration of system 100 adapted according to one embodiment of the invention. System 100 is a system for measuring the capacitor variation in a semiconductor device, wherein variation is the difference between an intended or nominal value and the actual value of a capacitor. System 100 includes LC oscillator 101, circuit 102 for capturing the output of LC oscillator 101, and computational unit 103 for comparing the captured output to a reference output and to evaluate the variation based thereon. System 100 is formed on a semiconductor chip with other circuits that include capacitors. The capacitor variation evaluated by system 100 is a measure of capacitor variation for all or nearly all capacitors in the chip. Systems according to the principles of system 100 can be designed in a variety of configurations, and one such configuration is shown in FIG. 2A.

Figure 2A:
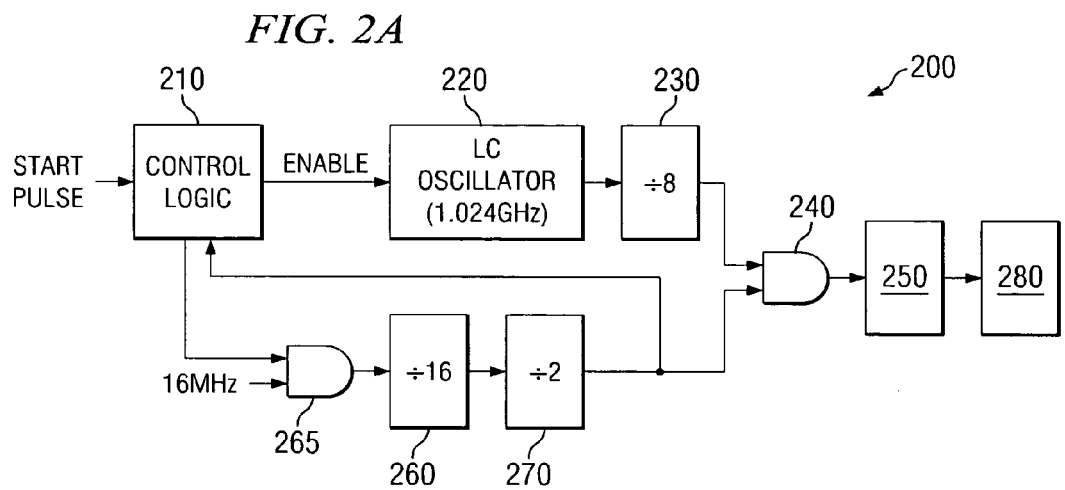
FIG. 2A is an illustration of an exemplary system adapted according to one embodiment of the invention.
Figure 2B:
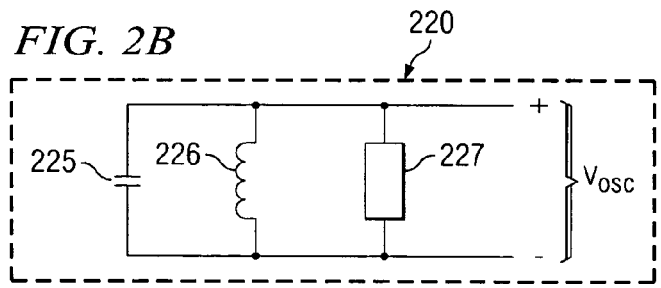
FIG. 2B shows a capacitor under test in a parallel LC configuration.
Figure 2C:
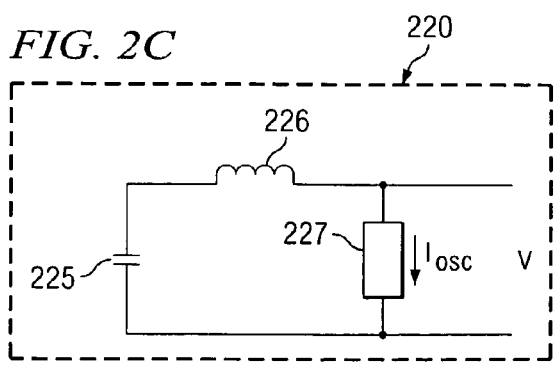
FIG. 2C shows a capacitor under test in a series LC configuration.

FIG. 2A is an illustration of exemplary system 200 adapted according to one embodiment of the invention. System 200 is operable to measure variation in a capacitor under test in LC oscillator 220. LC oscillator 220 can take a variety of forms and is shown in two basic configurations in FIGS. 2B and 2C. FIG. 2B shows capacitor under test 225 in a parallel LC configuration, and FIG. 2C shows capacitor under test 225 in a series LC configuration. LC oscillator 220 is not limited to any specific design, as long as it outputs a periodic signal, such as a sinusoid, square wave, or the like. Capacitor under test 225 is paired with inductor 226, which is of a known value, and negative resistance 227 (e.g., an active element providing positive feedback) to form an oscillator circuit. In many applications, inductors (especially those made on-chip) tend to have little variation, such that it is possible to know the value of the given inductor to a high degree of accuracy.

In operation of system 200 according to one embodiment, the first step is providing a start pulse to control logic 210. Control logic 210 then enables LC oscillator 220. At the same time, control logic 210 also sends a high signal to AND gate 265, thereby enabling input of the 16 MHz ($f_{ref}$) reference signal to divider 260. The output of divider 260 is the input for divider 270, the output of which is fed to AND gate 240.

System 200 is designed to allow LC oscillator 220 to come to steady state before any measurements are made, and such feature is provided by dividers 260 and 270 and AND gate 240. The output of divider 270 is a square wave that starts low (i.e., binary zero), such that the first $f_{ref}/16$ cycles cause a zero to be input into AND gate 240. The zero causes AND gate 240 to output a zero, thereby zeroing any pulses received from divider 230. The second $f_{ref}/16$ cycles cause a high value (i.e., binary one) to be input to AND gate 240. The one causes AND gate 240 to output the pulses that it receives from divider 230. Thus, the first $f_{ref}/16$ cycles is used to allow LC oscillator 220 to reach steady state before its output is captured. The second $f_{ref}/16$ cycles are the measurement period, wherein counter 250 captures the divided output of LC oscillator 220. In this design, the measurement period lasts 1 μsec. Control logic 210 disables LC oscillator after the end of the second $f_{ref}/16$ cycles.

Returning to the operation of LC oscillator 220, the output thereof is fed to divider 230 and to AND gate 240. LC oscillator 220 is designed such that if there is zero variation in capacitor under test 225, then LC oscillator 220 will output a 1.024 GHz pulse. If capacitor under test 225 has a larger than nominal capacitance, then the frequency of LC oscillator 220 will be lower than 1.024 GHz. On the other hand, if the capacitance of capacitor under test 225 is smaller than its nominal value, then the frequency will be higher. The capacitor change is an inverse squared function of the frequency change.

System 200 captures the output of LC oscillator 220 by counting the pulses of its divided output. In this specific example, LC oscillator 220 ideally causes counter 250 to store a value of one hundred twenty-eight during the 1 μsec measurement period. Thus, capacitor variation is measured by comparing the value stored in counter 250 to the ideal one hundred twenty-eight reference output. Each least significant bit difference in the stored value represents a 0.78125% change in frequency of LC oscillator 220 from its ideal frequency of 1.024 GHz.

The contents of counter 250 is sent to computational unit 280, which compares the stored value to one hundred twenty-eight, and from that comparison, evaluates the capacitor variation. Different techniques to evaluate capacitor variation from difference in the stored output are possible. In one example, the difference in the stored output is used to calculate the frequency of LC oscillator 220. Computational unit 280 then uses the frequency to find the capacitor variation in a look-up table. In another example, computational unit 280 inputs the oscillator frequency into a mathematical algorithm that calculates the capacitor variation from the frequency, the inductor value, and the nominal value of capacitor under test 225. Other embodiments evaluate the capacitor variation without actually calculating it. For example, one embodiment categorizes variation according to its degree in a finite number of classes. The invention is not limited to any particular technique to evaluate capacitor variation.

The embodiment of system 200 is meant to be an example only, and other embodiments may deviate from the configuration of system 200. For instance, the specific frequencies of LC oscillator 220 and the reference signal are not required by other embodiments, and the use of different values are within the scope of the invention. Just as the various frequencies are not required in some embodiments, the number and values of dividers in a given circuit are also not required in some embodiments. For instance, in an alternate embodiment, LC oscillator 220 may be designed to have an ideal operating frequency of 0.128 GHz, while divider 230 is eliminated from the system. However, the values of the frequencies of LC oscillator 220 and the reference signal may be influenced, in part, by one or more constraints, such as the size of inductor 226 needed to produce a given nominal frequency value, and the availability of a reference signal, such as a clock, in a larger system into which system 200 is adapted. Another constraint is the speed at which counter 250 can accurately operate, especially when implemented in Complementary Metal Oxide Semiconductor (CMOS) logic.

Further, some embodiments may not use the digital counter configuration shown in system 200 to determine variation. In an alternate embodiment, a system uses a phase frequency detector in a phase lock loop. In fact, any configuration that changes frequency to measurable quantity can be used in some embodiments.

Embodiments may include a variety of configurations. In one example configuration, LC oscillator 220 is part of a system under test, and the other parts of system 200 are included as equipment in a separate testing system adapted to test any LC oscillator. Thus, after the testing system tests LC oscillator 220, a user may reconnect the equipment to test another LC oscillator, by, for example, connecting to inputs on another chip with another LC oscillator.

Alternatively, system 200 may be part of a larger system, such as an on-chip tuner or other kind of application. FIG. 3A is an illustration of exemplary system 300 adapted according to one embodiment of the invention. FIG. 3B is an illustration of exemplary filter component 302 adapted according to one embodiment. System 300 is built on semiconductor chip 304 and includes system 200 (FIG. 2A), tuning unit 301, and filter component 302. As explained above with regard to system 200, capacitor variation is detected and evaluated. Information associated with the capacitor variation is passed to tuning component 301, which tunes filter 302 based, at least in part, on the capacitor variation. Tuning unit 301 may be, for example, hard-wired logic built on chip 304 or may be a functional unit that is based on machine-executable code.

In this example, system 300 employs filter component 302 to condition a signal, such as a Radio Frequency (RF) signal. Filter 302 includes three filter elements 310, 320, 330. Each filter element 310, 320, 330 has a different frequency response, and the frequency response of filter 302 is a function of the selection of one or more of filter elements 310, 320, 330. Filter elements 310, 320, 330 include capacitors that are similar to capacitor under test 225 (FIGS. 2B and 2C). In fact, because they are formed on the same chip, capacitor 225 and the capacitors of filter elements 310, 320, 330 are created in the same processes, and, therefore, will exhibit minimal relative variation (i.e., process variations within 1-2% of each other). Because of the capacitor variation, filter elements 310, 320, 330 will each differ somewhat from their nominal frequency responses. Tuning unit 301 accounts for the capacitor process variation by selecting filters with appropriate actual responses.

In one example, tuning unit 301 receives the information associated with capacitor variation, inputs the information into an algorithm, calculates the frequency responses of filter elements 310, 320, 330 therefrom, and selects one or more of filter elements 310, 320, 330 for a desired frequency response. In this example, a filter may be selected by closing its respective switch 315, 325, 335. Thus, if the capacitor variation causes each of filters 310, 320, 330 to shift its passband down by 10%, then tuning unit 301 may select a filter element based on its actual passband. In an alternate embodiment, tuning unit 301 may access a look-up table indexed by passband variations that specifies filter combinations. Any method to select one or more filter elements based on evaluated capacitor variation is within the scope of various embodiments.

In some embodiments, selecting one or more filter elements may be performed during a manufacturing process, such that the making and breaking of connections to the filter elements is permanent or semi-permanent. In other embodiments, it is performed during operation of the chip, for example, at power-up or during selection of frequency components of an input RF signal. For real-time tuning, switches 315, 325, and 335 may be made from transistors that can be turned on and off.

In one example real-time tuning application, each filter element 310, 320, 330 has a different passband, and elements 310, 320, 330 are arranged in increasing or decreasing order of center passband frequency. Thus, each filter element is associated with a frequency component of an input signal. As a tuner selects one or more frequency components of the input signal, system 300 switches from one filter element to another. Points at which filters are switched may be referred to as "breakpoints." In such a system tuning unit 301 tunes filter 302 by adjusting the breakpoints to compensate for frequency response shift due to capacitor variation.

In the example above, filter tuning is described as making/breaking connections to select discrete filter elements. However, various embodiments are not limited to any particular technique for tuning a filter. For instance, in one embodiment, circuitry before or after a given filter circuit may be adjusted to account for the effects of process variation in the capacitors. In another embodiment, other elements inside a filter circuit may be adjusted to tune the frequency response of a filter, based at least in part on capacitor process variation.

While the example in FIGS. 3A and 3B describes adjusting the behavior of a filter, various embodiments are not limited to adjusting filters. In fact, the principles described above may be used to adjust a variety of other circuit components that include capacitors. Examples of such components include oscillators.

FIG. 4 is an illustration of example system 400 adapted according to one embodiment of the invention. System 400 is an example RF tuner circuit, wherein filter 302 is preceded in the signal path by first mixer 403 and followed in the signal path by second mixer 404. The behavior of mixer 403 is controlled by local oscillator 401, and the behavior of mixer 404 is controlled by local oscillator 402. Either or both of oscillators 401 and 402 may be adjusted to change a center frequency of the signal to adapt to the offset center frequency of filter 302.

FIG. 5 is an illustration of exemplary method 500 adapted according to one embodiment of the invention. Method 500 may be performed, for example, by one or more devices on a semiconductor chip, and may even be performed entirely on a single semiconductor chip. In step 501, an oscillator is operated, the oscillator being an LC oscillator and including an inductor of known value and a capacitor under test. Step 501 may include, for example, enabling the LC oscillator and/or other parts of a testing circuit.

In step 502, an output of the oscillator is compared to a reference output. In one example, the output is captured by a counter than counts pulses from the oscillator during a defined time period. Then, the number of pulses counted is compared to a reference number that represents an ideal output. Various factors may influence the choice of the time period for capturing the output. For example, a longer time period may allow for more accuracy, while a shorter time period may allow for use of a smaller counter. Step 502 may also include allowing the LC oscillator to reach steady state before beginning capturing the output.

In step 503, a variation of the capacitor under test is evaluated based on the comparing. In the embodiment described above wherein cycles of the LC oscillator are compared to a reference number, the variation can be evaluated, for example, by determining the actual frequency of the LC oscillator and using the actual frequency to calculate the actual value of the capacitor under test. The variation is the difference between the actual and nominal values of the capacitance of the capacitor under test. Evaluating capacitor variation can be performed a variety of ways in various embodiments. In some embodiments, variation is calculated in Farads. In other embodiments, variation is calculated in percentage of nominal value. In still other embodiments, variation is approximated and classified in one or more categories of degree. Any technique for evaluating capacitor variation is within the scope of the invention.

In step 504, information associated with the evaluated variation is passed to a tuning element adapted to change the frequency response of a filter. The information may be an actual calculated value measured in Farads, a percentage value representing the variation, the actual capacitance value, or the like. The tuning element may be hardware-based or may be made of machine executable code and is operable to receive the information and adjust the frequency response of the filter accordingly. In this example, the filter includes one or more capacitors with the same or similar process variation as the capacitor under test so that the variation information is relevant to the operation of the filter.

In step 505, a frequency response of the filter is adjusted based at least in part on the variation. Different ways of adjusting the frequency response of the filter are possible. In one example, the filter includes a plurality of selectable filter elements, and the tuning element includes logic that selects one or more the filter elements in response to the variation. In another example embodiment, the filter may have other adjustable components that are manipulated to change the frequency response of the filter.

In one example, method 500 is performed as a system operates, such that the tuning component may perform step 505 continually, at specified times, in response to certain stimuli, or the like. In another example, method 500 is performed during manufacturing of a system, and the frequency response of the filter is set somewhat permanently.

An advantage of some embodiments is that process variation can be narrowed, effectively, to only that attributable to capacitors. Some prior art systems detect deviations in a time constant, and in RC circuits, the time constant depends on the capacitor and resistor. Because resistors formed on semiconductor chips often have significant variation, it is difficult to discern which portion of the deviation in time constant is due to resistor variation and which is due to process variation.

Various embodiments of the present invention pair a capacitor with an inductor of known value. Thus, the deviation from ideal can be assumed to be wholly attributable to the capacitor. Further, once capacitor variation for a chip is known, values for those capacitors that are in RC circuits can be known.

In some embodiments components to calculate capacitor variation can be formed on a single semiconductor chip along with other applications. For instance, such components can be added to a tuner on a chip, and the resulting system can be contained on that chip. The result is a chip-specific capacitor variation solution. Providing an accurate and dependable technique for measuring capacitor variation may facilitate the use of single-chip systems, thereby allowing for increases in miniaturization.

In some embodiments the components to calculate capacitor variation may be added to a chip design separate from the other logic. Variation of all or nearly all capacitors in the chip can be calculated accurately since the capacitor under test is formed in the same processes as the other capacitors that are in filters and other on-chip components. Accordingly, evaluating and compensating for capacitor variation can be performed continually or periodically. For example, evaluating and compensating for capacitor variation can take place during power on of a chip, when input frequency is changed, at regular intervals, or the like. Further, as chips age and components "drift," the drift can be evaluated and compensated for.

Yet another advantage of some embodiments is that the reference frequency may be taken from a clock that is used for another purpose. Therefore, some embodiments do not require additional clock circuitry.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for detecting capacitor variation in a device, said method comprising:
   operating an oscillator in said device, said oscillator being an Inductive-Capacitive (LC) oscillator and including an inductor of known value and a capacitor under test;
   comparing an output of said oscillator to a reference output;
   evaluating variation for a plurality of capacitors in said device based on said comparing;
   wherein comparing said output comprises:
      capturing cycles of said oscillator in a counter,
      outputting the contents of said counter to a computational circuit, and
      comparing said counter contents to a reference value by said computational circuit; and wherein said capturing cycles of said oscillator in said counter comprises:
dividing said output of said oscillator; and
zeroing portions of said divided output that do not occur in a designated time period.

2. The method of claim 1 wherein said designated time period is a function of an output of a reference oscillator.

3. A method for tuning an on-chip circuit, said method comprising:
measuring a variation of a first capacitor by oscillating said first capacitor in an Inductive-Capacitive (LC) circuit with an inductor of known value and comparing the output of the oscillator with a reference value;
adjusting a frequency response of said on-chip circuit based at least in part on said variation, said on-chip circuit including at least a second capacitor;
wherein said on-chip circuit is a filter that includes a plurality of filter components, each with a different frequency response, and wherein adjusting a frequency response comprises selecting a filter element based on said measured variation; and
wherein said selecting said filter element comprises:
permanently making or breaking one or more connections in said filter, thereby hardwiring said selection.

4. A method for detecting capacitor variation, said method comprising:
operating an oscillator, said oscillator being an Inductive-Capacitive (LC) oscillator and including an inductor of known value and a capacitor under test, wherein said capacitor under test is formed on a same semiconductor chip as a circuit component that comprises a plurality of other capacitors;
comparing an output of said oscillator to a reference output;
determining variation for said plurality of other capacitors based on said comparing; and
adjusting an operation of said circuit component in response to said determined variation;
wherein comparing said output comprises:
capturing cycles of said oscillator in a counter;
outputting the contents of said counter to a computational circuit; and
comparing said counter contents to a reference value by said computational circuit; and
wherein said capturing cycles of said oscillator in said counter comprises:
dividing said output of said oscillator;
zeroing portions of said divided output that do not occur in a designated time period.

* * * * *